United States Patent
Yee

(10) Patent No.: US 9,202,776 B2
(45) Date of Patent: Dec. 1, 2015

(54) STACKABLE MULTI-CHIP PACKAGE SYSTEM

(75) Inventor: Jae Hak Yee, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 1387 days.

(21) Appl. No.: 11/754,603

(22) Filed: May 29, 2007

(65) Prior Publication Data

US 2007/0278643 A1    Dec. 6, 2007

Related U.S. Application Data

(60) Provisional application No. 60/803,709, filed on Jun. 1, 2006.

(51) Int. Cl.
| | | |
|---|---|---|
| *H01L 23/02* | (2006.01) | |
| *H01L 23/495* | (2006.01) | |
| *H01L 23/31* | (2006.01) | |
| *H01L 23/00* | (2006.01) | |
| *H01L 25/065* | (2006.01) | |
| *H01L 25/10* | (2006.01) | |
| *H01L 23/552* | (2006.01) | |

(52) U.S. Cl.
CPC ...... *H01L 23/49537* (2013.01); *H01L 23/3121* (2013.01); *H01L 23/3135* (2013.01); *H01L 23/49575* (2013.01); *H01L 24/73* (2013.01); *H01L 25/0657* (2013.01); *H01L 25/105* (2013.01); *H01L 23/552* (2013.01); *H01L 24/48* (2013.01); *H01L 2224/16145* (2013.01); *H01L 2224/48091* (2013.01); *H01L 2224/48247* (2013.01); *H01L 2224/731* (2013.01); *H01L 2224/73207* (2013.01); *H01L 2225/0651* (2013.01); *H01L 2225/06562* (2013.01); *H01L 2225/06572* (2013.01); *H01L 2225/1029* (2013.01); *H01L 2225/1058* (2013.01); *H01L 2924/01029* (2013.01); *H01L 2924/01033* (2013.01); *H01L 2924/01046* (2013.01); *H01L 2924/01078* (2013.01); *H01L 2924/01079* (2013.01); *H01L 2924/01082* (2013.01); *H01L 2924/19107* (2013.01); *H01L 2924/3025* (2013.01)

(58) Field of Classification Search
USPC .................................. 257/686, E23.129, 777
See application file for complete search history.

(56) References Cited

U.S. PATENT DOCUMENTS

| | | | | |
|---|---|---|---|---|
| 5,422,435 A | * | 6/1995 | Takiar et al. ................... | 174/521 |
| 5,777,345 A | * | 7/1998 | Loder et al. .................... | 257/777 |
| 5,870,289 A | * | 2/1999 | Tokuda et al. ................. | 361/779 |
| 6,133,637 A | * | 10/2000 | Hikita et al. ................... | 257/777 |
| 6,337,510 B1 | | 1/2002 | Chun-Jen et al. | |
| 6,476,474 B1 | * | 11/2002 | Hung ............................ | 257/686 |
| 6,667,544 B1 | | 12/2003 | Glenn | |
| 6,723,585 B1 | | 4/2004 | Tu et al. | |
| 7,144,800 B2 | | 12/2006 | Mostafazadeh et al. | |
| 7,154,186 B2 | | 12/2006 | Noquil et al. | |

(Continued)

*Primary Examiner* — Colleen Matthews
*Assistant Examiner* — William Harriston
(74) *Attorney, Agent, or Firm* — Ishimaru & Associates LLP

(57) ABSTRACT

A stackable multi-chip package system is provided including forming an inter-chip structure adjacent to an external interconnect having both a base and a tip; connecting a first integrated circuit die and an outer portion of the base with the first integrated circuit die mounted over the inter-chip structure, connecting a second integrated circuit die and an inner portion of the base with the second integrated circuit die mounted under the inter-chip structure, and molding the first integrated circuit die, the second integrated circuit die, and the external interconnect partially exposed.

20 Claims, 4 Drawing Sheets

(56) References Cited

U.S. PATENT DOCUMENTS

| | | | |
|---|---|---|---|
| 2001/0042912 A1* | 11/2001 | Huang | 257/690 |
| 2002/0027266 A1* | 3/2002 | Wada et al. | 257/666 |
| 2002/0113305 A1* | 8/2002 | Huang | 257/690 |
| 2004/0041258 A1* | 3/2004 | Song et al. | 257/723 |
| 2004/0201086 A1* | 10/2004 | Joshi | 257/678 |
| 2004/0262734 A1* | 12/2004 | Yoo | 257/686 |
| 2005/0110127 A1* | 5/2005 | Kanemoto et al. | 257/686 |
| 2006/0180913 A1* | 8/2006 | Lee et al. | 257/686 |
| 2007/0262436 A1* | 11/2007 | Kweon et al. | 257/686 |

* cited by examiner

STACKABLE MULTI-CHIP PACKAGE SYSTEM

CROSS-REFERENCE TO RELATED APPLICATION

This application claims the benefit of U.S. Provisional Patent Application Ser. No. 60/803,709 filed Jun. 1, 2006.

TECHNICAL FIELD

The present invention relates generally to a stackable multi-chip package system, and more particularly to a stackable multi-chip package system with an encapsulation.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases. For example, on average there is approximately a 10 percent decrease in components for every product generation over the previous generation with equivalent functionality.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large scale IC ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a lead frame whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the ball-grid array ("BGA"). BGA packages typically comprise a substrate, such as a printed circuit board ("PCB"), with a semiconductor die having a multitude of bond pads mounted to the top side of the substrate. Wire bonds electrically connect the bond pads to a series of metal traces on the top side of the PCB. This series of metal traces is connected to a second series of metal traces on the back side of the PCB through a series of vias located around the outer periphery of the PCB. The second series of metal traces each terminates with a contact pad where a conductive solder ball is attached. Typically, the semiconductor die and the wire bonds are encapsulated within a molding compound.

In order to reduce manufacturing costs, the electronics industry is increasing the usage of perimeter BGA packages. In perimeter BGA packages, the conductive solder balls are arranged in an array pattern on the back side of the PCB between the vias and the semiconductor die. The inner-most conductive solder balls typically are beneath or in close proximity to the outer edges of the semiconductor die.

Still thinner, smaller, and lighter package designs and mounting/connecting configurations have been adopted in response to continuing requirements for further miniaturization. At the same time, users are demanding semiconductor packages that are more reliable under increasingly severe operating conditions.

Thus, a need still remains for a stackable multi-chip package system providing low cost manufacturing, increased miniaturization, greater packaging densities, improved yield, and improved reliability that are capable of achieving optimal thin, high-density footprint. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable multi-chip package system including forming an inter-chip structure adjacent to an external interconnect having both a base and a tip; connecting a first integrated circuit die and an outer portion of the base with the first integrated circuit die mounted over the inter-chip structure, connecting a second integrated circuit die and an inner portion of the base with the second integrated circuit die mounted under the inter-chip structure, and molding the first integrated circuit die, the second integrated circuit die, and the external interconnect partially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
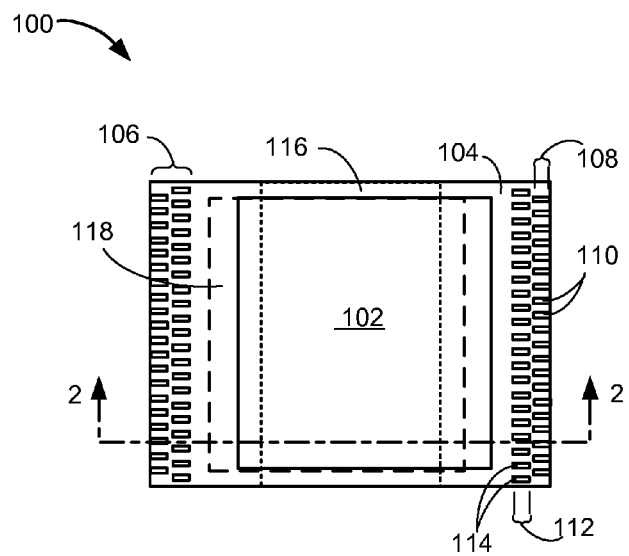
FIG. 1 is a top view of a stackable multi-chip package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of a stackable multi-chip package system 100 in a first embodiment of the present invention. The top view depicts a first integrated circuit die 102 surrounded an encapsulation 104, such as an epoxy mold compound. The first integrated circuit die 102 may serve as a thermal dissipation path for the stackable multi-chip package system 100. The first integrated circuit die 102 is preferably shown offset from the center towards to the right edge, in this view, of the stackable multi-chip package system 100.

The stackable multi-chip package system 100 has preferably dual land rows 106. The dual land rows 106 have a first row 108 of first lands 110, such as copper alloy, nickel/palladium, or gold alloy land sites, and a second row 112 of second lands 114, such as copper alloy, nickel/palladium, or gold alloy land sites. The first lands 110 and the second lands 114 may be made from any number of materials to provide a bondable surface.

The second lands 114 preferably extend more to the interior of the stackable multi-chip package system 100 than the first lands 110 such that the first lands 110 may be viewed as outer lands and the second lands 114 may be viewed as inner lands. The first row 108 and the second row 112 are preferably staggered allowing connection to the first lands 110 without impeding connections to the second lands 114.

For illustrative purposes, the stackable multi-chip package system 100 is shown having the dual land rows 106, although it is understood that the number of rows may differ. Also for illustrative purposes, the first integrated circuit die 102 is exposed to ambient, although it is understood that the first integrated circuit die 102 may not be exposed.

A region between dotted lines represents an inter-chip structure 116, such as a die-attach paddle, below the first integrated circuit die 102 and within the stackable multi-chip package system 100. The dashed rectangle represents a second integrated circuit die 118 also below the first integrated circuit die 102 and part of the stackable multi-chip package system 100. The second integrated circuit die 118 is preferably shown offset from the center towards to the left edge, in this view, of the stackable multi-chip package system 100.

The stackable multi-chip package system 100 is preferably a symmetrical package structure such that the top view and the bottom view (not shown) appear similar both having the dual land rows 106. This symmetrical structure allows for low profile, reliable, and low cost stacking.

Figure 2:
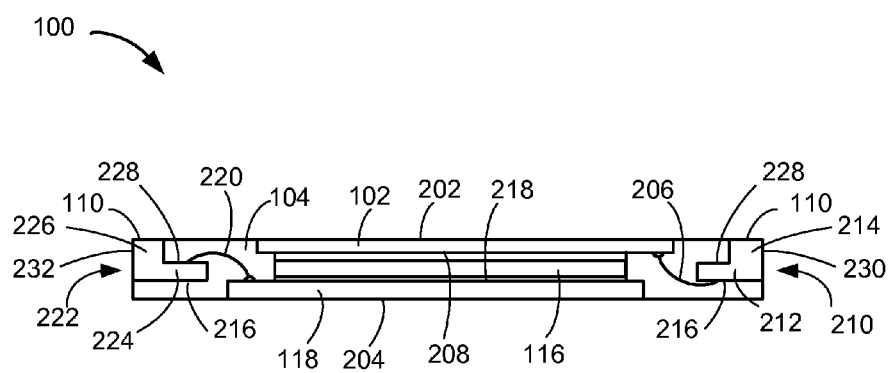
FIG. 2 is a cross-sectional view of the stackable multi-chip package system along line 2-2 of FIG. 1.

Referring now to FIG. 2, therein is shown a cross-sectional view of the stackable multi-chip package system 100 along line 2-2 of FIG. 1. The stackable multi-chip package system 100 includes a stack of integrated circuit dice with the first integrated circuit die 102, such as a thin or ultra thin integrated circuit die, above the second integrated circuit die 118, such as a thin or ultra thin integrated circuit die. The second integrated circuit die 118 and the first integrated circuit die 102 may be substantially the same or the same type, such as functionality or technology, or may be different.

A first non-active side 202 of the first integrated circuit die 102 and a second non-active side 204 of the second integrated circuit die 118 are exposed to ambient and may be used as a thermal dissipation surface. First internal interconnects 206, such as bond wires or ribbon bond wires, connect a first active side 208 of the first integrated circuit die 102 and first external interconnects 210, such as leads.

The first external interconnects 210 preferably have L-shape configurations with first bases 212 of the L-shape configurations extending more to the interior of the stackable multi-chip package system 100 than first tips 214 of the L-shape configuration. The first internal interconnects 206 attach to outer portions 216 of the first bases 212. The first tips 214 are part of the first lands 110 of the first row 108 of FIG. 1.

A second active side 218 of the second integrated circuit die 118 is below and faces the first active side 208 with the inter-chip structure 116, such as a die-attach paddle or an electromagnetic interference (EMI) shield, in between. The second integrated circuit die 118 is offset from the first integrated circuit die 102 such that the second integrated circuit die 118 and the inter-chip structure 116 do not perturb the connections of the first internal interconnects 206 and the first integrated circuit die 102. Second internal interconnects 220, such as bond wires or ribbon bond wires, connect the second active side 218 and second external interconnects 222, such as leads.

The second external interconnects 222 are shown preferably in similar L-shape configurations as and facing the first external interconnects 210 such that the first external interconnects 210 and the second external interconnects 222 appear as mirror images of each other. The L-shape configurations of the second external interconnects 222 preferably have second bases 224 extending more to the interior of the stackable multi-chip package system 100 than second tips 226 of the second external interconnects 222. The second internal interconnects 220 attach to inner portions 228 of the second bases 224. The second tips 226 are part of the first lands 110 of the first row 108 of FIG. 1.

The outer portions 216 of both the first bases 212 and the second bases 224 faces the direction towards the second integrated circuit die 118. The inner portions 228 of the first bases 212 and the second bases 224 faces the direction towards the first integrated circuit die 102.

The encapsulation 104 covers the second internal interconnects 220 and the first internal interconnects 206. The encapsulation 104 partially covers the first integrated circuit die 102, with the first non-active side 202 exposed, and the second integrated circuit die 118, with the second non-active side 204 exposed. The first integrated circuit die 102, the second integrated circuit die 118, the encapsulation 104, and the inter-chip structure 116 function collaboratively as a structure for planar rigity.

The encapsulation 104 also partially covers the first external interconnects 210 exposing the first lands 110 of the first external interconnects 210. A plane of the first tips 214 of the first lands 110 faces substantially the same direction as the first non-active side 202 and is substantially coplanar to a horizontal plane of the encapsulation 104 or the first non-active side 202. Similarly, the encapsulation 104 partially covers the second external interconnects 222 exposing the first lands 110 of the second external interconnects 222. A plane of the second tips 226 faces substantially the same direction as the first non-active side 202 and is substantially coplanar to a horizontal plane of the encapsulation 104 or the first non-active side 202. The encapsulation 104 further exposes a first side 230 of each of the first external interconnects 210 and a second side 232 of each of the second external interconnects 222 to ambient.

The stackable multi-chip package system 100 may be tested to verify known good devices (KGD) of the second integrated circuit die 118 and the first integrated circuit die 102. The stackable multi-chip package system 100 may be a thin package, especially with thin or ultra-thin dice, having a package height of 0.20 mm.

Figure 3:
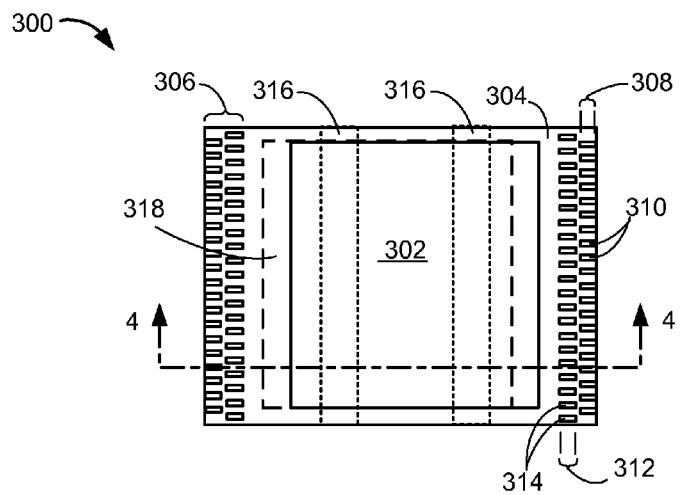
FIG. 3 is a top view of a stackable multi-chip package system in a second embodiment of the present invention.

Referring now to FIG. 3, therein is shown a top view of a stackable multi-chip package system 300 in a second embodiment of the present invention. The top view depicts a first integrated circuit die 302 surrounded an encapsulation 304, such as an epoxy mold compound. The first integrated circuit die 302 may serve as a thermal dissipation path for the stackable multi-chip package system 300. The first integrated circuit die 302 is preferably shown offset from the center towards to the right edge, in this view, of the stackable multi-chip package system 300.

The stackable multi-chip package system 300 has preferably dual land rows 306. The dual land rows 306 have a first row 308 of first lands 310, such as copper alloy, nickel/palladium, or gold alloy land sites, and a second row 312 of second lands 314, such as copper alloy, nickel/palladium, or gold alloy land sites. The first lands 310 and the second lands 314 may be made from any number of materials to provide a bondable surface.

The second lands 314 preferably extend more to the interior of the stackable multi-chip package system 300 than the first lands 310 such that the first lands 310 may be viewed as outer lands and the second lands 314 may be viewed as inner lands. The first row 308 and the second row 312 are preferably staggered allowing connection to the first lands 310 without impeding connections to the second lands 314.

For illustrative purposes, the stackable multi-chip package system 300 is shown having the dual land rows 306, although it is understood that the number of rows may differ. Also for illustrative purposes, the first integrated circuit die 302 is exposed to ambient, although it is understood that the first integrated circuit die 302 may not be exposed.

Regions between the closest dotted lines represent inter-chip structures 316, such as support structures, below the first integrated circuit die 302 and within the stackable multi-chip package system 300. The dashed rectangle represents a second integrated circuit die 318 also below the first integrated circuit die 302 and part of the stackable multi-chip package system 300. The second integrated circuit die 318 is preferably shown offset from the center towards to the left edge, in this view, of the stackable multi-chip package system 300.

One of the inter-chip structures 316 is adjacent to an edge of the first integrated circuit die 302 but also overlapping with the second integrated circuit die 318. Another one of the inter-chip structures 316 is also adjacent to an edge of the second integrated circuit die 318 but also overlapping the first integrated circuit die 302.

The stackable multi-chip package system 300 is preferably a symmetrical package structure such that the top view and the bottom view (not shown) appear similar both having the dual land rows 306. This symmetrical structure allows for low profile, reliable, and low cost stacking.

Figure 4:
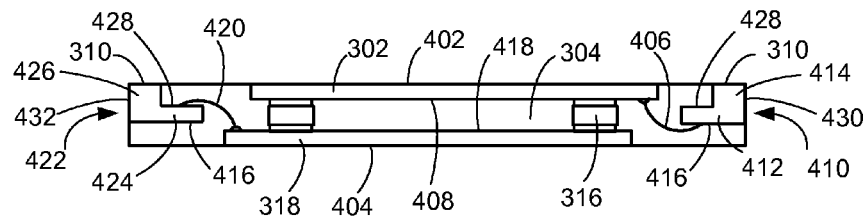
FIG. 4 is a cross-sectional view of the stackable multi-chip package system along line 4-4 of FIG. 3.

Referring now to FIG. 4, therein is shown a cross-sectional view of the stackable multi-chip package system 300 along line 4-4 of FIG. 3. The stackable multi-chip package system 300 includes a stack of integrated circuit dice with the first integrated circuit die 302, such as a thin or ultra thin integrated circuit die, above the second integrated circuit die 318, such as a thin or ultra thin integrated circuit die. The second integrated circuit die 318 and the first integrated circuit die 302 may be substantially the same or the same type, such as functionality or technology, or may be different.

A first non-active side 402 of the first integrated circuit die 302 and a second non-active side 404 of the second integrated circuit die 318 are exposed to ambient and may be used as a thermal dissipation surface. First internal interconnects 406, such as bond wires or ribbon bond wires, connect a first active side 408 of the first integrated circuit die 302 and first external interconnects 410, such as leads.

The first external interconnects 410 preferably have L-shape configurations with first bases 412 of the L-shape configurations extending more to the interior of the stackable multi-chip package system 300 than first tips 414 of the L-shape configuration. The first internal interconnects 406 attach to outer portions 416 of the first bases 412. The first tips 414 are part of the first lands 310 of the first row 308 of FIG. 3.

A second active side 418 of the second integrated circuit die 318 is below and faces the first active side 408 with the inter-chip structures 316 in between. The second integrated circuit die 318 is offset from the first integrated circuit die 302 such that the second integrated circuit die 318 and the inter-chip structures 316 do not perturb the connections of the first internal interconnects 406 and the first integrated circuit die 302. Second internal interconnects 420, such as bond wires or ribbon bond wires, connect the second active side 418 and second external interconnects 422, such as leads. The inter-chip structures 316 also do not impede the connections of the second internal interconnects 420 and the second integrated circuit die 318.

The second external interconnects 422 are shown preferably in similar L-shape configurations as and facing the first external interconnects 410 such that the first external interconnects 410 and the second external interconnects 422 appear as mirror images of each other. The L-shape configurations of the second external interconnects 422 preferably have second bases 424 extending more to the interior of the stackable multi-chip package system 300 than second tips 426 of the second external interconnects 422. The second internal interconnects 420 attach to inner portions 428 of the second bases 424. The second tips 426 are part of the first lands 310 of the first row 308 of FIG. 3.

The outer portions 416 of both the first bases 412 and the second bases 424 faces the direction towards the second integrated circuit die 318. The inner portions 428 of the first bases 412 and the second bases 424 faces the direction towards the first integrated circuit die 302.

The encapsulation 304 covers the second internal interconnects 420 and the first internal interconnects 406. The encapsulation 304 partially covers the first integrated circuit die 302, with the first non-active side 402 exposed, and the second integrated circuit die 318, with the second non-active side 404 exposed. The first integrated circuit die 302, the second integrated circuit die 318, the encapsulation 304, and the inter-chip structures 316 functions collaboratively as a structure for planar rigidity.

The encapsulation 304 also partially covers the first external interconnects 410 exposing the first lands 310 of the first external interconnects 410. Similarly, the encapsulation 304 partially covers the second external interconnects 422 exposing the first lands 310 of the second external interconnects 422. The encapsulation 304 further exposes a first side 430 of each of the first external interconnects 410 and a second side 432 of each of the second external interconnects 422 to ambient.

The stackable multi-chip package system 300 may be tested to verify known good devices (KGD) of the second integrated circuit die 318 and the first integrated circuit die 302. The stackable multi-chip package system 300 may be a thin package, especially with thin or ultra-thin dice, having a package height of 0.20 mm.

Figure 5:
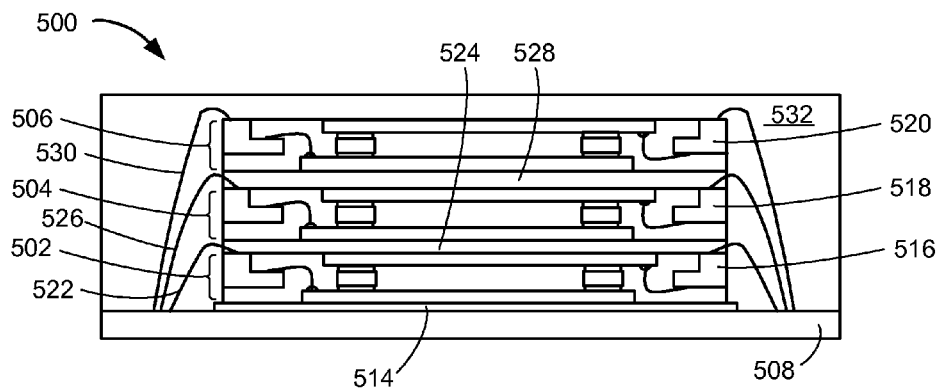
FIG. 5 is a cross-sectional view of an integrated circuit package-in-package system with the stackable multi-chip package system of FIG. 3 in a third embodiment of the present invention.

Referring now to FIG. 5, therein is shown a cross-sectional view of an integrated circuit package-in-package system 500 with the stackable multi-chip package system 300 of FIG. 3 in a third embodiment of the present invention. The integrated circuit package-in-package system 500 as a first package 502 stacked below a second package 504 with the second package 504 below a third package 506. The first package 502, the second package 504, and the third package 506 may be of similar or substantially the same as the stackable multi-chip package system 300.

The first package 502 is attached on a substrate 508, such as a printed circuit board, with an adhesive 514, such as a thermal adhesive. First package external interconnects 516 of the first package 502 are connected to the substrate 508 with first interconnects 522, such as bond wires.

The second package 504 stacks over the first package 502 with a first intra-stack structure 524, such as a film adhesive, in between. Second package external interconnects 518 of the second package 504 are connected to the substrate 508 with second interconnects 526, such as bond wires.

Similarly, the third package 506 stacks over the second package 504 with a second intra-stack structure 528, such as a film adhesive, in between. Third package external interconnects 520 of the third package 506 are connected to the substrate 508 with third interconnects 530, such as bond wires.

A package encapsulation 532 covers the first package 502, the second package 504, the third package 506, the first interconnects 522, the second interconnects 526, and the third interconnects 530. The package encapsulation 532 may be any number of materials, such as an epoxy molding compound.

The first package 502, the second package 504, and the third package 506 may be tested to ensure KGD before the package-in-package assembly process. This ensures any bad device is sorted out such that the yield for the integrated circuit package-in-package system 500 is not impacted by bad devices. The integrated circuit package-in-package system 500 may further undergo testing during and after assembly.

Figure 6:
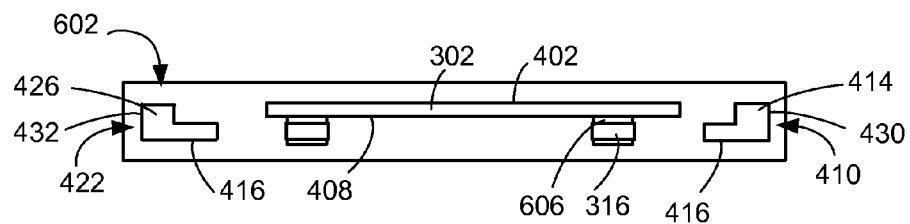
FIG. 6 is a cross-sectional view of a portion of a lead frame in a mounting phase of the first integrated circuit die.

Referring now to FIG. 6, therein is shown a cross-sectional view of a portion of a lead frame 602 in a mounting phase of the first integrated circuit die 302. The cross-sectional view depicts the portion of the lead frame 602 including one of the first external interconnects 410 and one of the second external interconnects 422 facing each other with the first side 430 and the second side 432 not facing each other. The inter-chip structures 316 are between the first external interconnects 410 and one of the second external interconnects 422.

The first tips 414 and the second tips 426 are preferably coplanar and facing upwards. The outer portions 416 of both the first external interconnects 410 and the second external interconnects 422 are facing downwards or in the opposite direction as the first tips 414 and the second tips 426.

The inter-chip structures 316 have corresponding sides coplanar with each other. The first integrated circuit die 302 is attached to the inter-chip structures 316 with a first adhesive 606, such as a die-attach adhesive, with the first active side 408 facing the inter-chip structures 316 and the first non-active side 402 facing away from the inter-chip structures 316. The first integrated circuit die 302 is mounted offset and not centered with the inter-chip structures 316.

Figure 7:
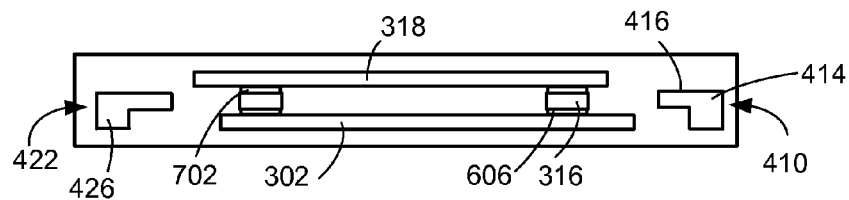
FIG. 7 is the structure of FIG. 6 in a vertically flipped orientation in a mounting phase of the second integrated circuit die.

Referring now to FIG. 7, therein is shown the structure of FIG. 6 in a vertically flipped orientation in a mounting phase of the second integrated circuit die 318. This structure has the outer portions 416 of both the first external interconnects 410 and the second external interconnects 422 are facing upwards. The first tips 414 and the second tips 426 shown facing downwards or in the opposite direction as the outer portions 416.

The first integrated circuit die 302 is attached to the inter-chip structures 316 with the first adhesive 606. The second integrated circuit die 318 is attached to the inter-chip structures 316 with a second adhesive 702, such as a die-attach adhesive, at a side opposite the first integrated circuit die 302. The second integrated circuit die 318 is mounted offset and not centered with the inter-chip structures 316. The offset of the second integrated circuit die 318 is toward the opposite direction as the offset for the first integrated circuit die 302.

Figure 8:
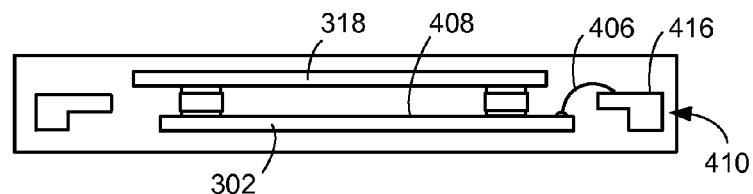
FIG. 8 is the structure of FIG. 7 in a connecting phase of the first integrated circuit die.

Referring now to FIG. 8, therein is shown the structure of FIG. 7 in a connecting phase of the first integrated circuit die 302. The first internal interconnects 406 connect the first active side 408 and the outer portions 416 of the first external interconnects 410. The offset of the second integrated circuit die 318 provides clearance for connecting the first internal interconnects 406 and the first integrated circuit die 302.

Figure 9:
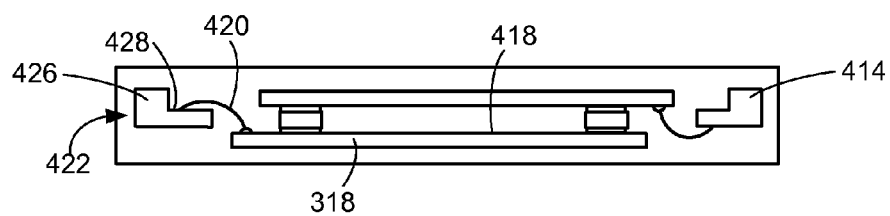
FIG. 9 is the structure of FIG. 8 in a vertically flipped orientation in a connecting phase of the second integrated circuit die.

Referring now to FIG. 9, therein is shown the structure of FIG. 8 in a vertically flipped orientation in a connecting phase of the second integrated circuit die 318. This orientation has the first tips 414 and the second tips 426 facing upward. The second internal interconnects 420 connect the inner portions 428 of the second external interconnects 422 and the second active side 418.

Figure 10:
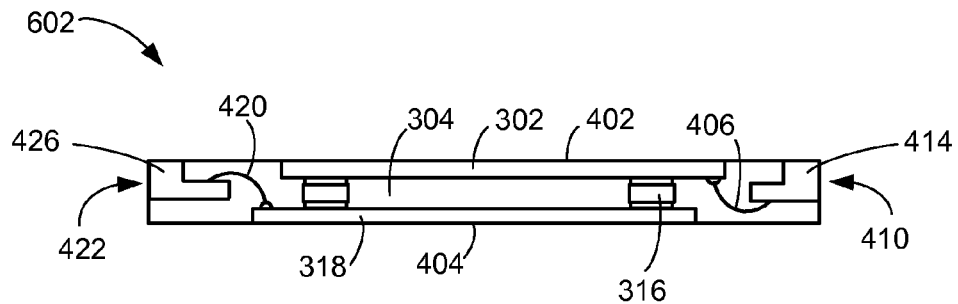
FIG. 10 is the structure of FIG. 9 in a forming phase of the encapsulation.

Referring now to FIG. 10, therein is shown the structure of FIG. 9 in a forming phase of the encapsulation 304. The encapsulation 304 cover the lead frame 602 including the first external interconnects 410, the second external interconnects 422, the inter-chip structures 316, the first internal interconnects 406, the second internal interconnects 420, the first integrated circuit die 302, and the second integrated circuit die 318. The encapsulation 304 exposes the first tips 414, the second tips 426, the first non-active side 402, and the second non-active side 404.

Figure 11:
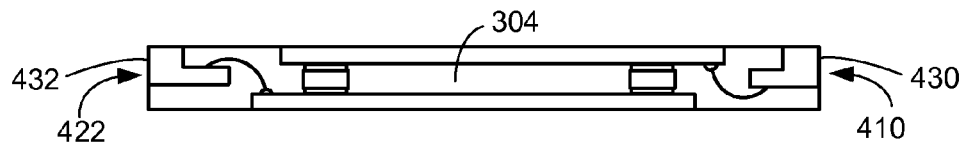
FIG. 11 is the structure of FIG. 10 in a singulating phase.

Referring now to FIG. 11, therein is shown the structure of FIG. 10 in a singulating phase. The lead frame 602 of FIG. 10 may optionally undergo plating. The lead frame 602 undergoes singulation forming the stackable multi-chip package system 300. The singulation process exposes the first side 430 of the first external interconnects 410 and the second side 432 of the second external interconnects 422 from the encapsulation 304.

Figure 12:
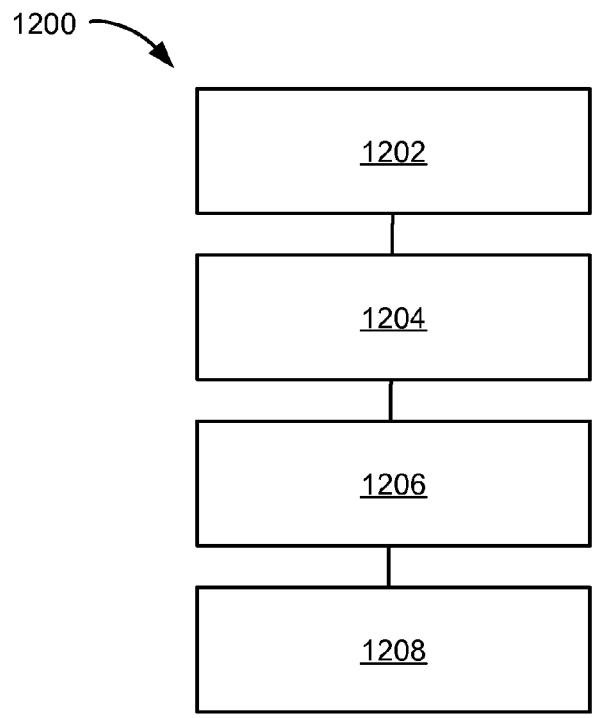
FIG. 12 is a flow chart of a stackable multi-chip package system for manufacturing the stackable multi-chip package system in an embodiment of the present invention.

Referring now to FIG. 12, therein is shown a flow chart of a stackable multi-chip package system 1200 for manufacturing the stackable multi-chip package system 100 in an embodiment of the present invention. The system 1200 includes forming an inter-chip structure adjacent to an external interconnect having both a base and a tip in a block 1202; connecting a first integrated circuit die and an outer portion of the base with the first integrated circuit die mounted over the inter-chip structure in a block 1204; connecting a second integrated circuit die and an inner portion of the base with the second integrated circuit die mounted under the inter-chip structure in a block 1206; and molding the first integrated circuit die, the second integrated circuit die, and the external interconnect partially exposed in a block 1208.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the stackable multi-chip package system of the present invention furnishes important and heretofore unknown and unavailable solutions, capabilities, and functional aspects for improving yield, increasing reliability, and reducing cost of stackable multi-chip package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing a stackable multi-chip package comprising:
   forming an inter-chip structure adjacent to an external interconnect having both a base and a tip,
   connecting a first integrated circuit die and an outer portion of the base with a first active side of the first integrated circuit die mounted facing the inter-chip structure,
   connecting a second integrated circuit die and an inner portion of the base with a second active side of the second integrated circuit die mounted facing the inter-chip structure, and
   molding the first integrated circuit die, the second integrated circuit die, and the external interconnect partially exposed, an exposed plane of the tip facing substantially the same direction as and substantially coplanar to a first non-active side of the first integrated circuit die.

2. The method as claimed in claim 1 wherein:
   connecting the first integrated circuit die includes mounting the first integrated circuit die in a first offset over the inter-chip structure; and
   connecting the second integrated circuit die further includes mounting the second integrated circuit die in a second offset under the inter-chip structure with the second offset in the opposite direction to the first offset.

3. The method as claimed in claim 1 wherein molding the external interconnect includes:
   molding the base;
   exposing the tip; and
   exposing a side of the external interconnect.

4. The method as claimed in claim 1 wherein molding the first integrated circuit die and the second integrated circuit die includes:
   molding the inter-chip structure;
   exposing a first non-active side of the first integrated circuit die; and
   exposing a second non-active side of the second integrated circuit die.

5. The system as claimed in claim 1 further comprising:
   mounting a first stackable multi-chip package system over a substrate;
   stacking a second stackable multi-chip package system over the first stackable multi-chip package system; and
   molding the first stackable multi-chip package system and the second stackable multi-chip package system with the substrate.

6. A method for manufacturing a stackable multi-chip package comprising:
   forming an inter-chip structure adjacent to an external interconnect having both a base and a tip;
   mounting a first integrated circuit die over the inter-chip structure in a first offset with a first non-active side of the first integrated circuit die facing away from the inter-chip structure;
   connecting the first integrated circuit die and an outer portion of the base;

mounting a second integrated circuit die under the inter-chip structure in a second offset with a second non-active side of the second integrated circuit die facing away from the inter-chip structure;

connecting the second integrated circuit die and an inner portion of the base;

molding the first integrated circuit die, the second integrated circuit die, and the external interconnect; and exposing the tip, an exposed plane of the tin facing substantially the same direction as and substantially coplanar to the first non-active side.

7. The method as claimed in claim 6 wherein the molding includes:
   exposing a first land; and
   exposing a second land.

8. The method as claimed in claim 6 wherein:
   forming the inter-chip structure includes:
      forming inter-chip structures;
   mounting the first integrated circuit die also includes:
      mounting the first integrated circuit die over the inter-chip structures; and
   mounting the second integrated circuit die further includes:
      mounting the second integrated circuit die over the inter-chip structures.

9. The method as claimed in claim 6 wherein forming the inter-chip structure adjacent to the external interconnect includes forming the inter-chip structure having substantially the same material as the external interconnect.

10. The system as claimed in claim 6 wherein:
    mounting the first integrated circuit die over the inter-chip structure includes:
       facing a first active side of the first integrated circuit die to the inter-chip structure; and
    mounting the second integrated circuit die over the inter-chip structure further includes:
       facing a second active side of the second integrated circuit die to the inter-chip structure.

11. A stackable multi-chip package system comprising:
    an external interconnect having both a base and a tip;
    an inter-chip structure adjacent to the external interconnect;
    a first integrated circuit die over the inter-chip structure and connected with an outer portion of the base;
    a second integrated circuit die under the inter-chip structure and connected with an inner portion of the base; and
    an encapsulation to partially cover the first integrated circuit die, the second integrated circuit die, and the external interconnect, an exposed plane of the tip facing substantially the same direction as and substantially coplanar to a first non-active side of the first integrated circuit die.

12. The system as claimed in claim 11 wherein:
    the first integrated circuit die over the inter-chip structure is at a first offset to the inter-chip structure; and
    the second integrated circuit die under the inter-chip structure is at a second offset to the inter-chip structure with the second offset in the opposite direction to the first offset.

13. The system as claimed in claim 11 wherein the encapsulation to partially cover the external interconnect includes:
    the encapsulation covers the base; and
    the encapsulation exposes the tip and a side of the external interconnect.

14. The system as claimed in claim 11 wherein the encapsulation to partially cover the first integrated circuit die and the second integrated circuit die includes:
    the encapsulation covers the inter-chip structure; and
    the encapsulation exposes a first non-active side of the first integrated circuit die and a second non-active side of the second integrated circuit die.

15. The system as claimed in claim 11 wherein:
    the first integrated circuit die over the inter-chip structure is at a first offset to the inter-chip structure;
    the second integrated circuit die under the inter-chip structure is at a second offset to the inter-chip structure with the second offset in the opposite direction to the first offset; and
    the encapsulation exposes the tip and covers the inter-chip structure.

16. The system as claimed in claim 15 wherein the encapsulation includes:
    a first land exposed; and
    a second land exposed.

17. The system as claimed in claim 15 wherein:
    the first integrated circuit die over the inter-chip structure includes:
       a first active side of the first integrated circuit die facing the inter-chip structure;
    the second integrated circuit die under the inter-chip structure further includes:
       a second active side of the second integrated circuit die facing the inter-chip structure.

18. The system as claimed in claim 15 wherein:
    the inter-chip structure includes:
       inter-chip structures;
    the first integrated circuit die over the inter-chip structure also includes:
       the first integrated circuit die over the inter-chip structures; and
    the second integated circuit die under the inter-chip structure further includes:
       the second integrated circuit die under the inter-chip structures.

19. The system as claimed in claim 15 wherein the inter-chip structure includes substantially the same material as the external interconnect.

20. The system as claimed in claim 11 further comprising:
    a first stackable multi-chip package system over a substrate;
    a second stackable multi-chip package system over the first stackable multi-chip package system; and
    a package encapsulation to cover the first stackable multi-chip package system and the second stackable multi-chip package system with the substrate.

* * * * *